(12) United States Patent
Cheng et al.

(10) Patent No.: US 9,030,384 B2
(45) Date of Patent: May 12, 2015

(54) OLED PANEL WITH PARTITION PLATE

(71) Applicant: Ye Xin Technology Consulting Co., Ltd., Hsinchu (TW)

(72) Inventors: Jung-An Cheng, Hsinchu (TW); Liang-Neng Chien, Hsinchu (TW); Wei-Li Wang, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 57 days.

(21) Appl. No.: 13/948,389

(22) Filed: Jul. 23, 2013

(65) Prior Publication Data

US 2014/0361965 A1      Dec. 11, 2014

(30) Foreign Application Priority Data

Jun. 11, 2013   (TW) .............................. 102120652 A

(51) Int. Cl.
*G09G 3/28* (2013.01)
*G09G 3/32* (2006.01)

(52) U.S. Cl.
CPC .................................... *G09G 3/3208* (2013.01)

(58) Field of Classification Search
None
See application file for complete search history.

(56) References Cited

U.S. PATENT DOCUMENTS

2008/0238836 A1* 10/2008 Uchino et al. .................. 345/76

* cited by examiner

*Primary Examiner* — Nicholas Lee
(74) *Attorney, Agent, or Firm* — Novak Druce Connolly Bove + Quigg LLP

(57) ABSTRACT

An OLED panel includes a plurality of pixels. Each pixel includes a first sub-pixel, a second sub-pixel and a third sub-pixel spaced from each other by a plurality of baffle plates. The first sub-pixel of each pixel is located adjacent to that of a neighboring pixel. The first sub-pixel of each pixel is spaced from that of the neighboring pixel by a partition plate. The partition plate has a height less than a height of each baffle plate.

20 Claims, 11 Drawing Sheets

OLED PANEL WITH PARTITION PLATE

BACKGROUND

1. Technical Field

The disclosure generally relates to an organic light emitting diode (OLED) panel, and particularly to an OLED panel having partition plates for obtaining a high resolution.

2. Description of Related Art

Organic light emitting diode (OLED) panels are widely used in display applications. Referring to FIG. 1, a typical OLED panel includes a plurality of pixels each consisting of a red sub-pixel, a green sub-pixel and a blue sub-pixel. Each sub-pixel is formed by jetting ink in a chamber surrounded by baffle plates. The light emitting efficiency of the red sub-pixel is larger than that of the green sub-pixel, which is larger than that of the blue sub-pixel. In order to balance the light intensity of the three sub-pixels, the area of the blue sub-pixel is generally larger than that of the green sub-pixel, which is larger than that of the red sub-pixel. Thus, the three sub-pixels can have equal light intensity.

However, limited to technical condition, the typical OLED panel cannot obtain high pixels per inch. The smallest diameter of the conventional jetted drop of the ink is 12.4 µm. That is to say, if the width of the sub-pixel is less than the smallest diameter of the drop, the drop cannot be totally jetted in the chamber of the sub-pixel, thereby causing overflow or color blending. Thus, the typical OLED panel cannot have a high resolution.

What is needed, therefore, is an OLED panel with partition plates which can address the limitations described above.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the various views.

DETAILED DESCRIPTION

Figure 1:
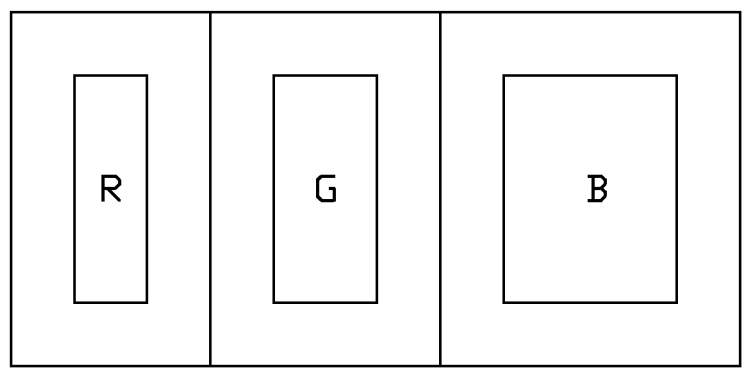
FIG. 1 schematically shows a pixel of an OLED panel in the related art.
Figure 2:
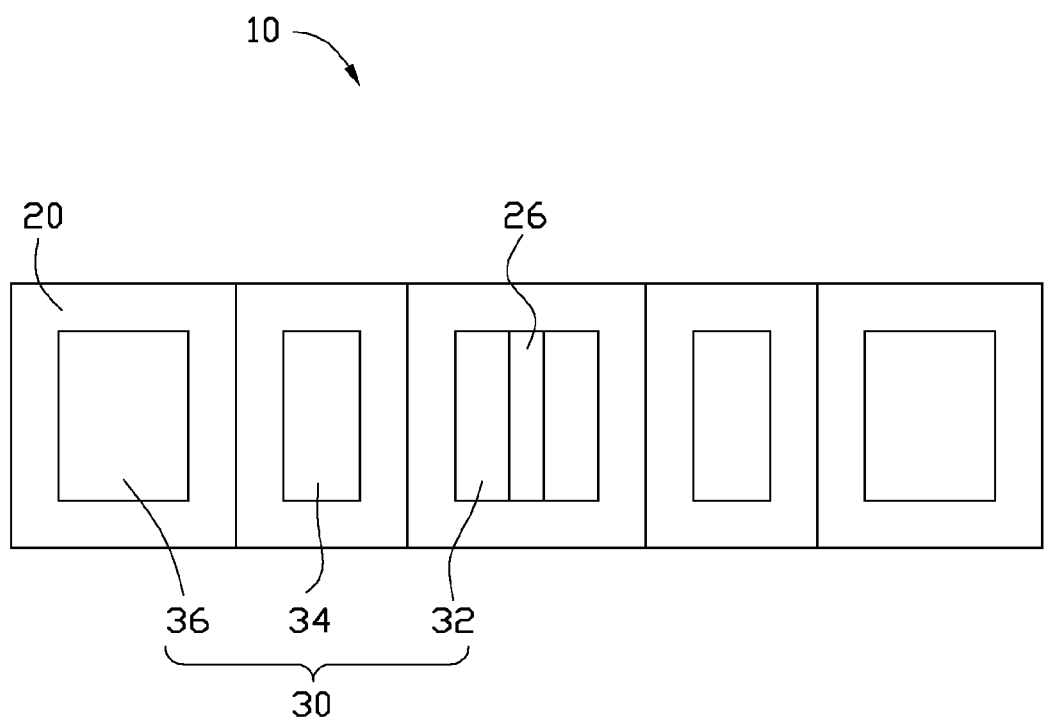
FIG. 2 schematically shows an OLED panel in accordance with a first embodiment of the present disclosure.
Figure 3:
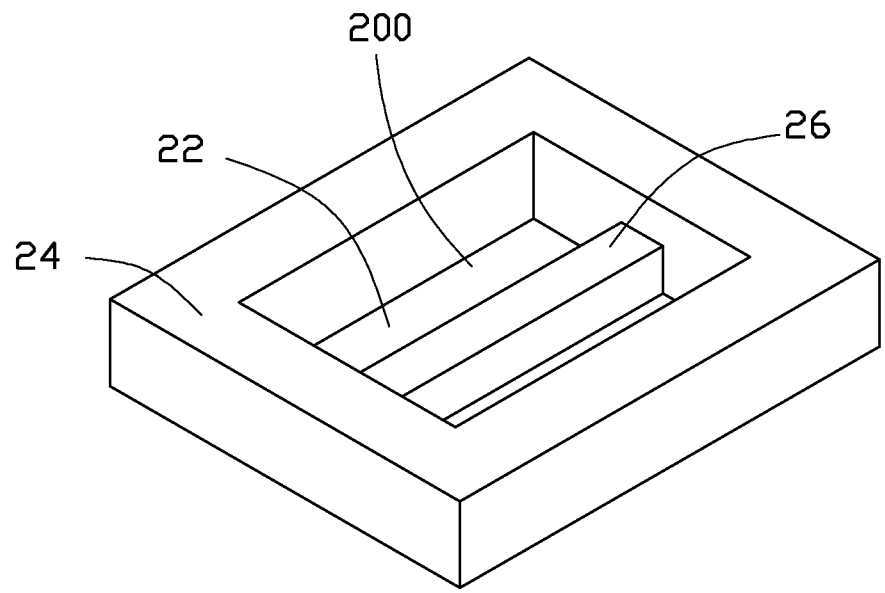
FIG. 3 shows a part of the OLED panel of FIG. 2 from another aspect.

FIGS. 2-3 show an OLED panel 10 in accordance with a first embodiment of the present disclosure is shown. The OLED panel 10 includes a substrate 20 and a plurality of pixels 30 formed on the substrate 20. The substrate 20 includes a bottom plate 22 and a plurality of baffle plates 24 extending upwardly from the bottom plate 22. In this embodiment, the baffle plates 24 are made of black materials. Each pixel 30 includes a first sub-pixel 32, a second sub-pixel 34 and a third sub-pixel 36. In this embodiment, the first sub-pixel 32 is a red sub-pixel, the second sub-pixel 34 is a green sub-pixel, and the third sub-pixel 36 is a blue sub-pixel. The second sub-pixel 34 has an area less than an area of the third sub-pixel 36, and larger than an area of the first sub-pixel 32. The first sub-pixel 32, the second sub-pixel 34 and the third sub-pixel 36 have a rectangular shape, and each pixel 30 is also rectangular.

Each of the second and third sub-pixels 34, 36 is received in a chamber 200 surrounded by four baffle plates 24. The three sub-pixels 32, 34, 36 of each pixel 30 are spaced from each other by the baffle plates 24. The first sub-pixel 32 of each pixel 30 is located adjacent to the first sub-pixel 32 of a neighboring pixel 30. The first sub-pixel 32 of each pixel 30 is spaced by a partition plate 26 from the first sub-pixel 32 of the neighboring pixel 30. Each first sub-pixel 34 is received in a chamber 200 surrounded by three baffle plates 24 and one partition plate 26. The partition plate 26 has a height less than a height of the baffle plate 24. The arrangement of the sub-pixels 32, 34, 36 of each pixel 30 is symmetrical with the arrangement of the neighboring pixel 30 about the partition plate 26. In this embodiment, the first sub-pixel 32 has a width of about 8.2 µm, the second sub-pixel 34 has a width of about 15.8 µm, the third sub-pixel 36 has a width of about 23.4 µm, the baffle plate 24 has a width of about 9 µm, and the partition plate has a width of about 18 µm. The width of each first sub-pixel 32 is less than a smallest diameter (12.4 µm) of a conventional jetted drop of ink. However, upper portions of the chambers 200 of the two adjacent first sub-pixels 32 still communicate with each other through a space just above the partition plate 26. Thus, when the drop of a red ink is jetted in one first sub-pixel 32, it overflows out of the chamber 200 of the first sub-pixel 32 into the chamber 200 of the adjacent first sub-pixel 32 through the space just above the partition plate 26. Finally, the red ink remaining in the chamber 200 of the one first sub-pixel 32 and overflowing to the chamber 200 of the adjacent first sub-pixel 32 has level lower than a top face of the partition plate 26. In other words, the red ink in the chamber 200 of the one first sub-pixel 32 is spaced from the red ink in the chamber 200 of the adjacent first sub-pixel 32. Therefore, the two first sub-pixels 32 are formed. The second sub-pixel 34 and the third sub-pixel 36 can be formed by directly jetting corresponding ink into the chambers 200 thereof since the width of the second sub-pixel 34 and the third sub-pixel 36 are both larger than the smallest diameter of the drop of the corresponding ink. The OLED panel 10 of this embodiment can obtain 250 PPI (pixels per inch).

Figure 4:
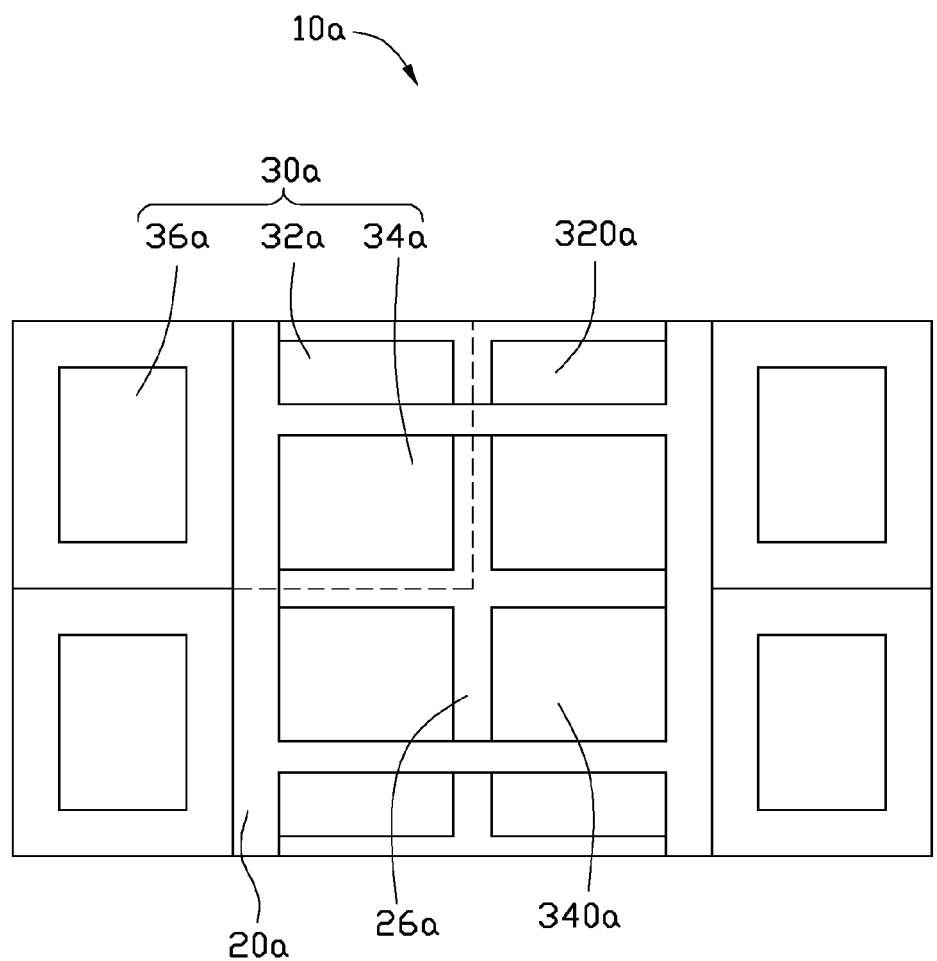
FIG. 4 schematically shows an OLED panel in accordance with a second embodiment of the present disclosure.
Figure 5:
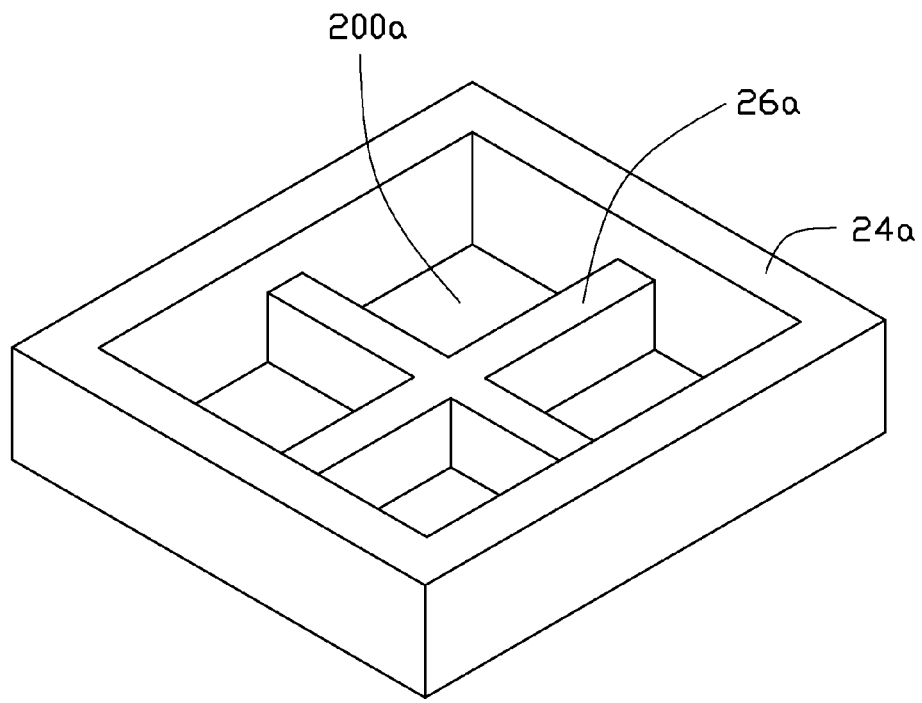
FIG. 5 shows a part of the OLED panel of FIG. 4 from another aspect.

FIGS. 4-5 show an OLED panel 10a different from the first embodiment shown in FIGS. 2-3. Each pixel 30a includes a first sub-pixel 32a, a second sub-pixel 34a and a third sub-pixel 36a spaced from each other by baffle plates 24a. In this embodiment, the first sub-pixel 32a is a red sub-pixel, the second sub-pixel 34a is a green sub-pixel, and the third sub-pixel 36a is a blue sub-pixel. The second sub-pixel 34a has an area less than an area of the third sub-pixel 36a, and larger than an area of the first sub-pixel 32a. The first sub-pixel 32a, the second sub-pixel 34a and the third sub-pixel 36a have a rectangular shape, and each pixel 30a is also rectangular. The first sub-pixel 32a of each pixel 30a is located adjacent to the first sub-pixel 32a of a neighboring pixel 30a in the same row, and also adjacent to the first sub-pixel 32a of a neighboring pixel 30a in the same column. The second sub-pixel 34a of each pixel 30a is located adjacent to the second sub-pixel 34a of a neighboring pixel 30a in the same row, and also adjacent to the second sub-pixel 34a of a neighboring pixel 30a in the same column That is to say, the arrangement of the three sub-pixels 32a, 34a, 36a of each pixel 30a is symmetrical with the arrangement of the neighboring pixel 30a in the same row as well as the neighboring pixel 30a in the same column.

A plurality of first sub-pixel units 320a and second sub-pixel units 340a are alternately arranged in the same column. Each first sub-pixel unit 320a includes four first sub-pixels 32a arranged in four corners thereof, and each second sub-pixel unit 340a includes four second sub-pixels 34a arranged in four corners thereof. The four first sub-pixels 32a of each first sub-pixel unit 320a are spaced from each other by crossed partition plates 26a. The four second sub-pixels 34a of each second pixel unit 340a are also spaced from each other by crossed partition plates 26a. Each partition plate 26a has a height less than a height of each baffle plate 24a. The third sub-pixels 36a of neighboring pixels 30a are spaced from each other by baffle plates 24a. In this embodiment, one ink drop can be distributed to four chambers 200a of the four adjacent first sub-pixels 32a of each first sub-pixel unit 320a, as well as four chambers 200a of the four adjacent second sub-pixels 34a of each second sub-pixel unit 340a. Thus, the width of the first sub-pixel 32a and the second sub-pixel 34a can be further decreased, and the resolution of the OLED panel 10a is accordingly increased. Preferably, the width of the first sub-pixel 32a is about 9.8 μm, the width of the second sub-pixel 34a is about 19 μm, the width of the third sub-pixel 36a is about 23.4 μm, a width of the baffle plate 24a is about 9 μm, and a width of the partition plate 26a is about 18 μm. The PPI of the OLED panel 10a of this embodiment can be 250.

Figure 6:
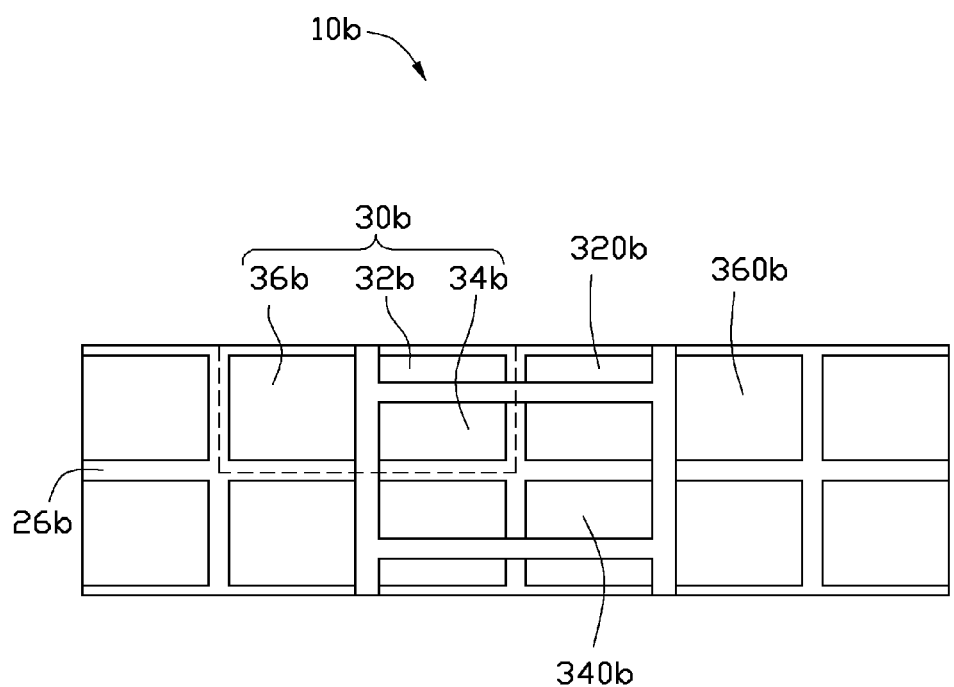
FIG. 6 schematically shows an OLED panel in accordance with a third embodiment of the present disclosure.
Figure 7:
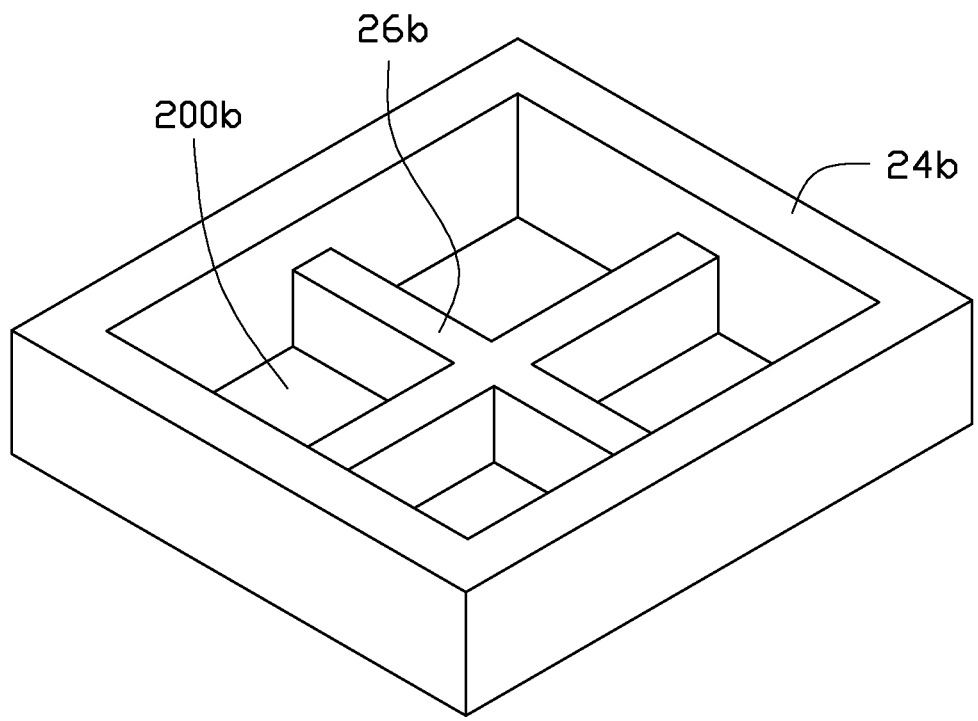
FIG. 7 shows a part of the OLED panel of FIG. 6 from another aspect.

FIGS. 6-7 show an OLED display 10b different from the first embodiment and the second embodiment shown in FIGS. 2-5. Each pixel 30b also includes a first sub-pixel 32b, a second sub-pixel 34b and a third sub-pixel 36b spaced from each other by baffle plates 24b. In this embodiment, the first sub-pixel 32b is a red sub-pixel, the second sub-pixel 34b is a green sub-pixel, and the third sub-pixel 36b is a blue sub-pixel. The second sub-pixel 34b has an area less than an area of the third sub-pixel 36b, and larger than an area of the first sub-pixel 32b. The first sub-pixel 32b, the second sub-pixel 34b and the third sub-pixel 36b have a rectangular shape, and each pixel 30b is also rectangular. The first sub-pixel 32b of each pixel 30b is located adjacent to the first sub-pixel 32b of a neighboring pixel 30b in the same row, and also adjacent to the first sub-pixel 32b of a neighboring pixel 30b in the same column. The second sub-pixel 34b of each pixel 30b is located adjacent to the second sub-pixel 34b of a neighboring pixel 30b in the same row, and also adjacent to the second sub-pixel 34b of a neighboring pixel 30b in the same column The third sub-pixel 36b of each pixel 30b is located adjacent to the third sub-pixel 36b of a neighboring pixel 30b in the same row, and also adjacent to that of a neighboring pixel 30b in the same column. That is to say, the arrangement of the three sub-pixels 32b, 34b, 36b of each pixel 30b is symmetrical with the arrangement of the neighboring pixel 30b in the same row as well as the neighboring pixel 30b in the same column.

A plurality of first sub-pixel units 320b and second sub-pixel units 340b are alternately arranged in the same column, and a plurality of third sub-pixel units 360b are arranged in the same column Each first sub-pixel unit 320b includes four first sub-pixels 32b arranged in four corners thereof, each second sub-pixel unit 340b includes four second sub-pixels 34b arranged in four corners thereof, and each third sub-pixel unit 360b includes four third sub-pixels 36b arranged in four corners thereof. The four first sub-pixels 32b of each first sub-pixel unit 320b are spaced from each other by crossed partition plates 26b. The four second sub-pixels 34b of each second pixel unit 340b are also spaced from each other by crossed partition plates 26b. The four third sub-pixels 36b of each third sub-pixel unit 360b are also spaced from each other by crossed partition plates 26b. Each partition plate 26b has a height less than a height of each baffle plate 24b. In this embodiment, one ink drop can be distributed to not only four chambers 200b of the four adjacent first sub-pixels 32b of each first sub-pixel unit 320b and four chambers 200b of the four adjacent second sub-pixels 34b of each second sub-pixel unit 340b, but also four chambers 200b of the four adjacent third sub-pixels 36b of each third sub-pixel unit 360b. Thus, the width of the first sub-pixel 32b, the second sub-pixel 34b and the third sub-pixel 36b can be decreased, and the resolution of the OLED panel 10b is further increased. Preferably, the width of the first sub-pixel 32b is about 9.8 μm, the width of the second sub-pixel 34b is about 19 μm, the width of the third sub-pixel 36b is about 23.4 μm, a width of the baffle plate 24b is about 9 μm, and a width of the partition plate 26b is about 18 μm. The PPI of the OLED panel 10b of this embodiment can be 350.

Figure 8:
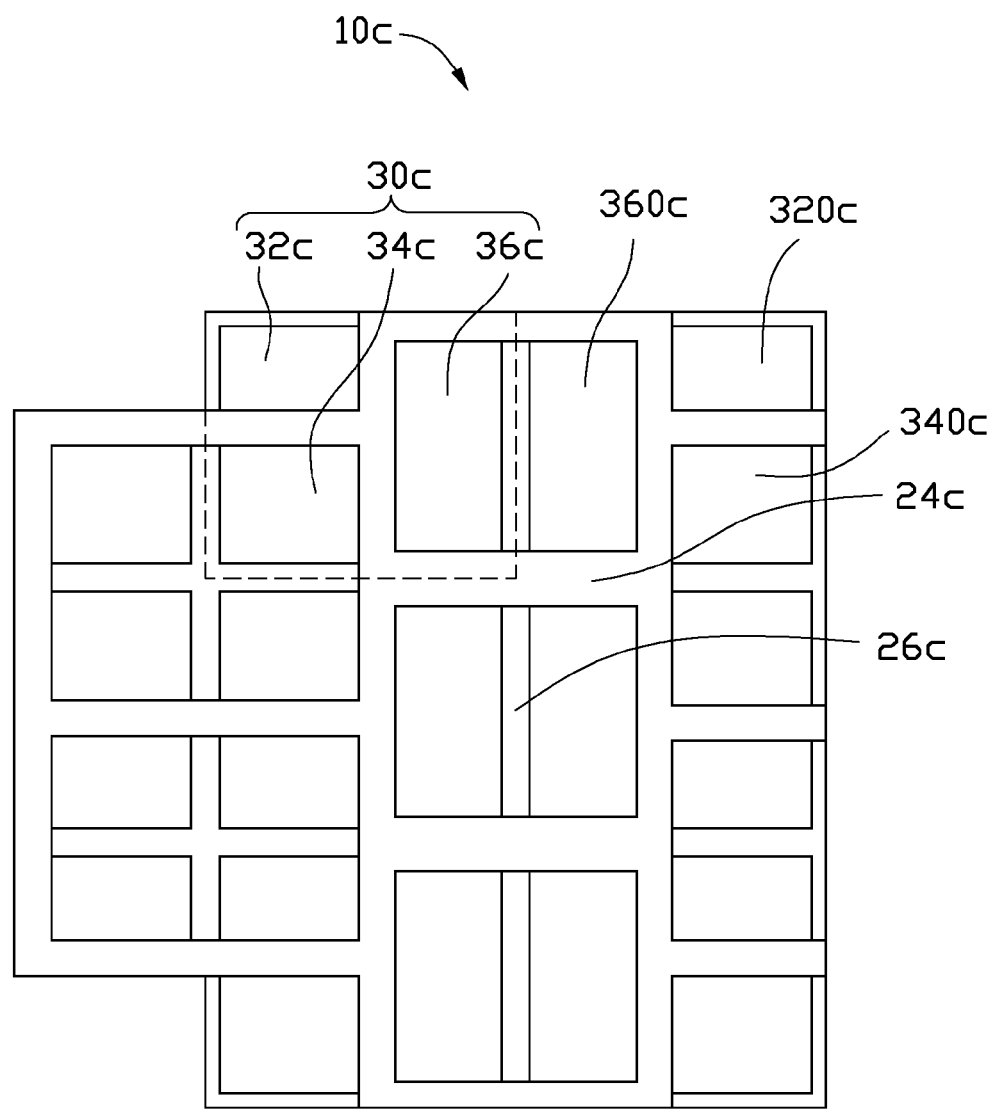
FIG. 8 schematically shows an OLED panel in accordance with a fourth embodiment of the present disclosure.
Figure 9:
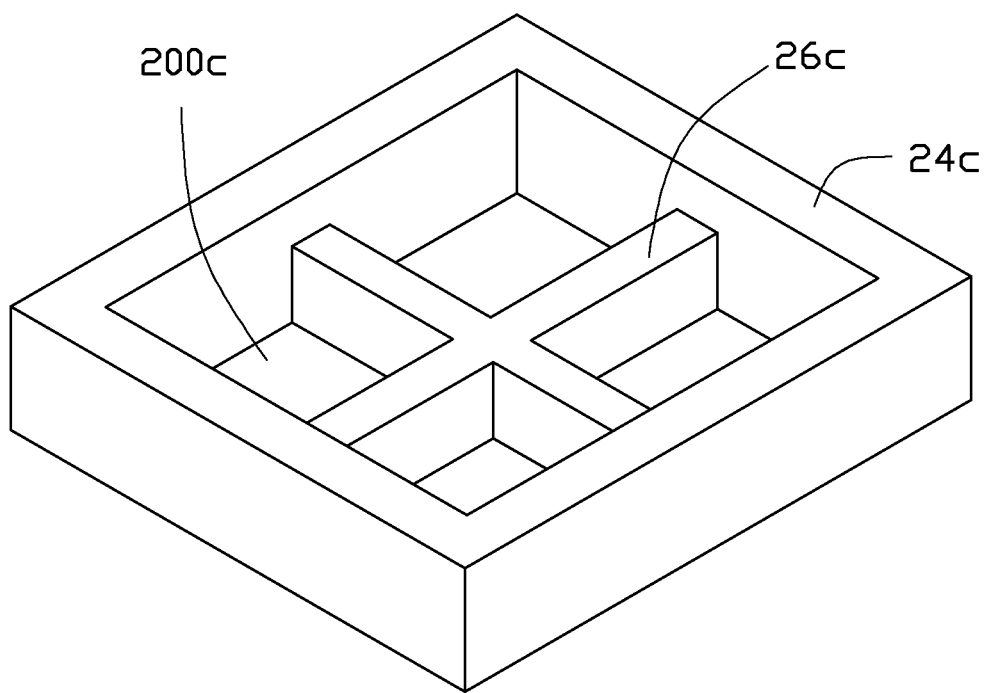
FIG. 9 shows a part of the OLED panel of FIG. 8 from another aspect.

FIGS. 8-9 show an OLED display 10c different from the first embodiment, the second embodiment and the third embodiment shown in FIGS. 2-7. Each pixel 30c also includes a first sub-pixel 32c, a second sub-pixel 34c and a third sub-pixel 36c spaced from each other by baffle plates 24c. In this embodiment, the first sub-pixel 32c is a red sub-pixel, the second sub-pixel 34c is a green sub-pixel, and the third sub-pixel 36c is a blue sub-pixel. The second sub-pixel 34c has an area less than an area of the third sub-pixel 36c, and larger than an area of the first sub-pixel 32c. The first sub-pixel 32c, the second sub-pixel 34c and the third sub-pixel 36c have a rectangular shape, and each pixel 30c is also rectangular. The first sub-pixel 32c of each pixel 30c is located adjacent to the first sub-pixel 32c of a neighboring pixel 30c in the same row, and also adjacent to the first sub-pixel 32c of a neighboring pixel 30c in the same column. The second sub-pixel 34c of each pixel 30c is located adjacent to the second sub-pixel 34c of a neighboring pixel 30c in the same row, and also adjacent to the second sub-pixel 34c of a neighboring pixel 30c in the same column. The third sub-pixel 36c of each pixel 30c is located adjacent to the third sub-pixel 36c of a neighboring pixel 30c in the same row, and also adjacent to the sub-pixel 36c of a neighboring pixel 30c in the same column. That is to say, the arrangement of the three sub-pixels 32c, 34c, 36c of each pixel 30c is symmetrical with the arrangement of the neighboring pixel 30c in the same row as well as the neighboring pixel 30c in the same column.

A plurality of first sub-pixel units 320c and second sub-pixel units 340c are alternately arranged in the same column, and a plurality of third sub-pixel units 360c are arranged in the same column. Each first sub-pixel unit 320c includes four first sub-pixels 32c arranged in four corners thereof, each second sub-pixel unit 340c includes four second sub-pixels 34c arranged in four corners thereof, and each third sub-pixel unit 360c includes two third sub-pixels 36c arranged in two opposite ends thereof. The four first sub-pixels 32c of each first sub-pixel unit 320c are spaced from each other by crossed partition plates 26c. The four second sub-pixels 34c of each second pixel unit 340c are also spaced from each other by crossed partition plates 26c. The two third sub-pixels 36c of each third sub-pixel unit 360c are spaced from each other by a straight partition plate 26c. Two adjacent third sub-pixel units 360c are spaced from each other by a baffle plate 24c. Each partition plate 36c has a height less than a height of each baffle plate 24c. In this embodiment, one ink drop can be distributed to not only four chambers 200c of the four adjacent first sub-pixels 32c of each first sub-pixel unit 320c and four chambers 200c of the four adjacent second sub-pixels 34c of each second sub-pixel unit 340c, but also two chambers 200c of the two adjacent third sub-pixels 36c of each third sub-pixel unit 360c. Thus, the width of the first sub-pixel 32c, the second sub-pixel 34c and the third sub-pixel 36c can be decreased, and the resolution of the OLED panel 10c is increased accordingly. Preferably, the width of the first sub-pixel 32c is about 6.13 µm, the width of the second sub-pixel 34c is about 11.87 µm, a width of the third sub-pixel 36c is about 13.5 µm, a width of the baffle plate 24c is about 15 µm. The partition plate 26c between the two adjacent third sub-pixel units 360c has a width of about 15.72 µm, the partition plate 26c between the first sub-pixel 32c and the third sub-pixel 34c of each pixel 30c has a width of about 20.8 µm, the partition plate 26c between the second sub-pixel 34c and the third sub-pixel 36c of each pixel 30c has a width of about 20.8 µm, and the partition plate 26c between the first sub-pixel 32c and the second sub-pixel 34c of each pixel 30c has a about width of 12 µm. The PPI of the OLED panel 10c of this embodiment can be 350.

Figure 10:
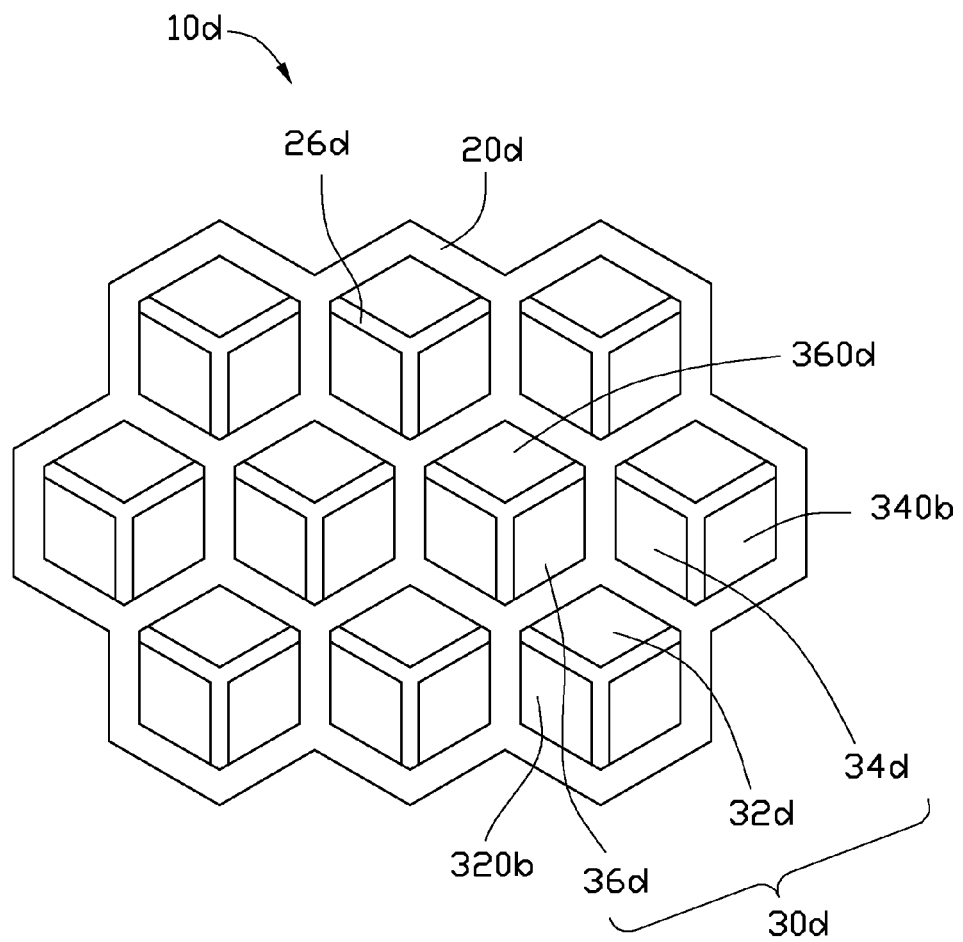
FIG. 10 schematically shows an OLED panel in accordance with a fifth embodiment of the present disclosure.
Figure 11:
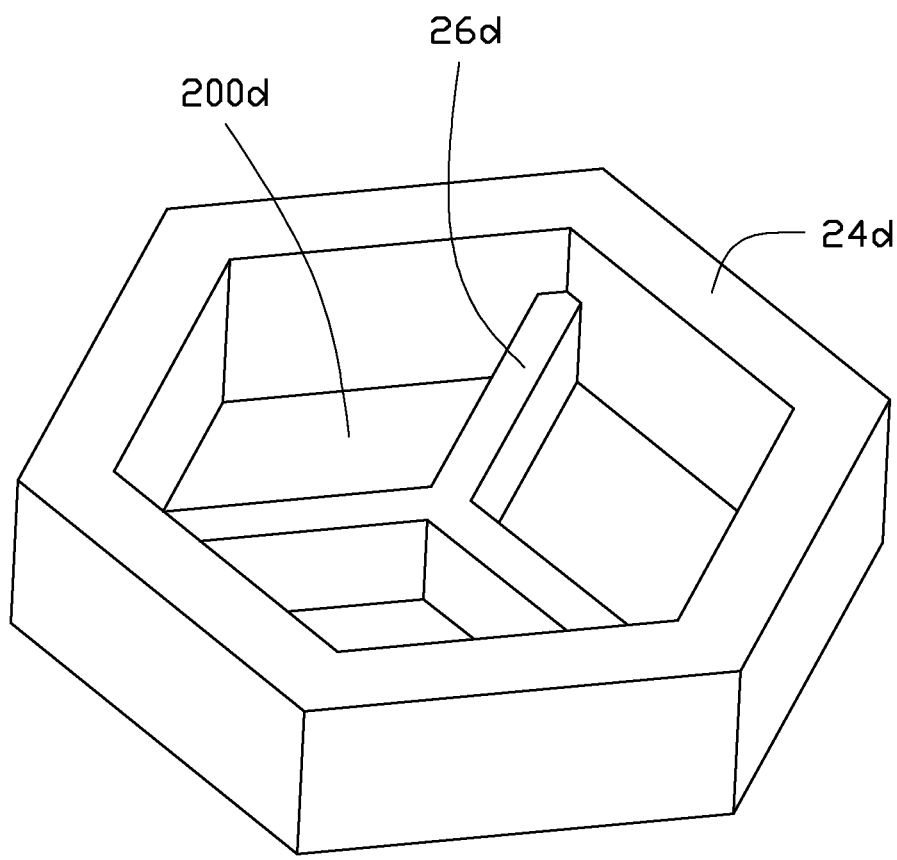
FIG. 11 shows a part of the OLED panel of FIG. 10 from another aspect.

FIGS. 10-11 show an OLED panel 10d according to a fourth embodiment. Each pixel 30d includes a first sub-pixel 32d, a second sub-pixel 34d and a third sub-pixel 36d spaced from each other by baffle plates 24d. In this embodiment, the first sub-pixel 32d is a red sub-pixel, the second sub-pixel 34d is a green sub-pixel, and the third sub-pixel 36d is a blue sub-pixel. Each pixel 30d has a hexagonal shape, and the first sub-pixel 32d, the second sub-pixel 34d and the third sub-pixel 36d of each pixel 30d are rhombic and have the same area. The baffle plates 24d spacing the first sub-pixel 32d, the second sub-pixel 34d and the third sub-pixel 36d of each pixel 30d cooperatively form a Y shape. Each pixel 30d is surrounded by six neighboring pixels 30d. The first sub-pixel 32d of each pixel 30d is located adjacent to two first sub-pixels 32d of two neighboring pixels 30d. The three neighboring first sub-pixels 32d cooperative form a first sub-pixel unit 320d. The first sub-pixel unit 320d is also hexagonal and surrounded by hexagonal baffle plates 24d. The three first sub-pixels 32d of the first sub-pixel unit 320d are spaced from each other by Y-shaped partition plates 26d. Every two neighboring partition plates 26d of the first sub-pixel unit 320d are angled about 120 degrees from each other. The second sub-pixel 34d of each pixel 30d is located adjacent to two second sub-pixels 34d of two neighboring pixels 30d. The three neighboring second sub-pixels 34d cooperative form a second sub-pixel unit 340d. The second sub-pixel unit 340d is also hexagonal and surrounded by hexagonal baffle plates 24d. The three second sub-pixels 34d of the second sub-pixel unit 340d are spaced from each other by Y-shaped partition plates 26d. Every two neighboring partition plates 26d of the second sub-pixel unit 340d are angled about 120 degrees from each other. The third sub-pixel 36d of each pixel 30d is located adjacent to two third sub-pixels 36d of two neighboring pixels 30d. The three neighboring third sub-pixels 36d cooperative form a third sub-pixel unit 360d. The third sub-pixel unit 360d is also hexagonal and surrounded by hexagonal baffle plates 24d. The three third sub-pixels 36d of the third sub-pixel unit 360d are spaced from each other by Y-shaped partition plates 26d. Every two neighboring partition plates 26d of the third sub-pixel unit 360d are angled about 120 degrees from each other. Each partition plate 26d has a height less than a height of each baffle plate 24d. In this embodiment, one ink drop can be distributed to three chambers 200d of the three neighboring first sub-pixels 32d of each first sub-pixel unit 320d, three chambers 200d of the three neighboring second sub-pixels 34d of each second sub-pixel unit 340d, and three chambers 200d of the three neighboring third sub-pixels 36d of each third sub-pixel unit 360d. Thus, the width of the first sub-pixel 32d, the second sub-pixel 34d and the third sub-pixel 36d can be decreased, and the resolution of the OLED panel 100d is increased. The PPI of the OLED panel 100d of this embodiment can be 350.

The first sub-pixel 32, 32a, 32b, 32c, 32d, the second sub-pixel 34, 34a, 34b, 34c, 34d and the third sub-pixel 36, 36a, 36b, 36c, 36d of each pixel 30, 30a, 30b, 30c, 30d is not limited to RGB arrangement, and can also be Pentile arrangement or stripe arrangement.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An organic light emitting diode (OLED) panel comprising:
a plurality of pixels each comprising a first sub-pixel, a second sub-pixel and a third sub-pixel spaced from each other by a plurality of baffle plates;
wherein the first sub-pixel of each pixel is located adjacent to the first sub-pixel of a neighboring pixel;
wherein the first sub-pixel of each pixel is spaced from the first sub-pixel of the neighboring pixel by a partition plate; and
wherein the partition plate has a height less than a height of each baffle plate.

2. The OLED panel of claim 1, wherein an arrangement of the first sub-pixel, the second sub-pixel and the third sub-pixel of each pixel is symmetrical with an arrangement of the first sub-pixel, the second sub-pixel and the third sub-pixel of the neighboring pixel about the partition plate.

3. The OLED panel of claim 1, wherein the second sub-pixel of each pixel is located adjacent to the second sub-pixel of the neighboring pixel.

4. The OLED panel of claim 3, wherein the second sub-pixel of each pixel is spaced from the second sub-pixel of the neighboring pixel by a partition plate.

5. The OLED panel of claim 1, wherein four first sub-pixels of four neighboring pixels cooperatively form a first sub-pixel unit, and four second sub-pixels of four neighboring pixels cooperatively form a second sub-pixel unit.

6. The OLED panel of claim 5, wherein the four first sub-pixels of the first sub-pixel unit are spaced from each other by crossed partition plates, and the four second sub-pixels of the second sub-pixel unit are spaced from each other by crossed partition plates.

7. The OLED panel of claim 5, wherein the first sub-pixel unit and the second sub-pixel unit are spaced from each other by one baffle plate.

8. The OLED panel of claim 5, wherein the third sub-pixel of each pixel is surrounded by four connected baffle plates.

9. The OLED panel of claim 5, wherein the third sub-pixel of each pixel is located adjacent to the third sub-pixel of another neighboring pixel.

10. The OLED panel of claim 9, wherein the third sub-pixel of each pixel is spaced from the third sub-pixel of the other neighboring pixel by a partition plate.

11. The OLED panel of claim 10, wherein two third sub-pixels of two neighboring pixels cooperatively form a third sub-pixel unit, the third sub-pixel unit being spaced from a neighboring third sub-pixel unit by one of the baffle plates.

12. The OLED panel of claim 5, wherein four third sub-pixels of four neighboring pixels cooperatively form a third sub-pixel unit.

13. The OLED panel of claim 12, wherein the four third sub-pixels of the third sub-pixel unit are spaced from each other by crossed partition plates.

14. The OLED panel of claim 1, wherein an arrangement of the first sub-pixel, the second sub-pixel and the third sub-pixel of each pixel is symmetrical with an arrangement of the first sub-pixel, the second sub-pixel and the third sub-pixel of a neighboring pixel in a same column.

15. The OLED panel of claim 1, wherein an arrangement of the first sub-pixel, the second sub-pixel and the third sub-pixel of each pixel is symmetrical with an arrangement of the first sub-pixel, the second sub-pixel and the third sub-pixel of a neighboring pixel in a same row.

16. The OLED panel of claim 1, wherein each pixel has a hexagonal shape, and each of the first sub-pixel, the second sub-pixel and the third sub-pixel has a rhombic shape.

17. The OLED panel of claim 16, wherein three first sub-pixels of three neighboring pixels cooperatively form a first sub-pixel unit, three second sub-pixels of three neighboring pixels cooperatively form a second sub-pixel unit, and three third sub-pixels of three neighboring pixels cooperatively form a third sub-pixel unit.

18. The OLED panel of claim 17, wherein the three first sub-pixels of the first sub-pixel unit are spaced from each other by three connected partition plates, the three second sub-pixels of the second sub-pixel unit are spaced from each other by three connected partition plates, the three third sub-pixels of the third sub-pixel unit are spaced from each other by three connected partition plates.

19. The OLED panel of claim 17, wherein the first sub-pixel unit is surrounded by hexagonal baffle plates, the second sub-pixel unit is surrounded by hexagonal baffle plates, and the third sub-pixel unit is surrounded by hexagonal baffle plates.

20. The OLED panel of claim 1, wherein the first sub-pixel, the second sub-pixel and the third sub-pixel of each pixel have one of RGB, Pentile and stripe arrangements.

* * * * *